(12) United States Patent
Shander et al.

(10) Patent No.: US 8,936,217 B2
(45) Date of Patent: Jan. 20, 2015

(54) METHODS AND SYSTEMS FOR INCORPORATING TRANSLATING BACKPLANES TO FACILITATE WIRE SEPARATION

(75) Inventors: Mark Stephen Shander, Mill Creek, WA (US); Robert Thomas Johnson, Everett, WA (US)

(73) Assignee: The Boeing Company, Chicago, IL (US)

( * ) Notice: Subject to any disclaimer, the term of this patent is extended or adjusted under 35 U.S.C. 154(b) by 661 days.

(21) Appl. No.: 13/246,470

(22) Filed: Sep. 27, 2011

(65) Prior Publication Data

US 2013/0075530 A1    Mar. 28, 2013

(51) Int. Cl.
*B64D 47/00*  (2006.01)
*H02B 1/015*  (2006.01)
*H02K 7/02*  (2006.01)
*H02K 7/18*  (2006.01)
*H05K 7/14*  (2006.01)

(52) U.S. Cl.
CPC .................................. *H05K 7/1438* (2013.01)
USPC ............................. 244/131; 361/627; 361/809

(58) Field of Classification Search
CPC ....... B64D 47/00; B60R 16/0238; H02G 3/02
USPC .............. 244/131; 361/627, 807, 809; 439/78
See application file for complete search history.

(56) References Cited

U.S. PATENT DOCUMENTS

| 5,234,348 | A | * | 8/1993 | Konsevich et al. | 439/61 |
| 5,348,482 | A | | 9/1994 | Rudy, Jr. et al. | |
| 5,622,506 | A | * | 4/1997 | Hornig et al. | 439/74 |
| 5,980,312 | A | | 11/1999 | Chapman et al. | |
| 6,320,750 | B2 | | 11/2001 | Shaler et al. | |
| 6,801,769 | B1 | | 10/2004 | Royalty | |
| 6,850,415 | B2 | | 2/2005 | Dimarco | |
| 7,307,851 | B2 | | 12/2007 | Dimarco | |
| 8,616,501 | B2 | * | 12/2013 | Brownjohn et al. | 244/131 |
| 2001/0015888 | A1 | | 8/2001 | Shaler et al. | |
| 2002/0090844 | A1 | * | 7/2002 | Kocin | 439/74 |
| 2010/0306435 | A1 | | 12/2010 | Nigoghosian et al. | |

\* cited by examiner

*Primary Examiner* — Rob Swiatek
(74) *Attorney, Agent, or Firm* — Armstrong Teasdale LLP

(57) ABSTRACT

A method for interconnecting electronic equipment within an aircraft includes installing a multi-dimensional backplane within the aircraft across a plurality of frame bays associated with the aircraft, the backplane including a plurality of connectors mounted thereon, contacts associated with the connectors interconnected by electrical conductors formed within the backplane, attaching shipside wiring to a first portion of the connectors on the backplane, and attaching electrical connectors of the electronic equipment to corresponding connectors on the backplane.

18 Claims, 5 Drawing Sheets

METHODS AND SYSTEMS FOR INCORPORATING TRANSLATING BACKPLANES TO FACILITATE WIRE SEPARATION

BACKGROUND

The field of the disclosure relates generally to separation of signals in complex systems to address electromagnetic interference concerns, for example, and more specifically, to methods and systems for incorporating translating backplanes to facilitate wire separation.

Physical wire separation requirements are difficult to achieve in heavily congested areas such as might be found within an airplane. This physical wire separation challenge is compounded by confining structure and/or equipment packaging physically located near equipment wiring interfaces.

Use of WIPS (Wire Integration Panels) and/or complex wiring bundles have been used in the past to spatially integrate wiring within an airplane. In some confined spaces where spatial restrictions are involved, minimum wire separation has been difficult to achieve, and in some cases has not been achieved. In spaces where minimum wire separation cannot be achieved, such spaces are generally eliminated as candidate locations for equipment.

The addition of wire integration panels and/or the elimination of candidate equipment locations due to volume constraints are undesirable solutions, particularly for new aircraft designs where volume, weight, and cost targets are particularly challenging.

BRIEF DESCRIPTION

In one aspect, a method for interconnecting electronic equipment within an aircraft is provided. The method includes installing a multi-dimensional backplane within the aircraft across a plurality of frame bays associated with the aircraft, the backplane including a plurality of connectors mounted thereon. The connectors are interconnected by one or more electrical conductors, optical waveguides, pneumatic lines, and/or hydraulic lines formed within the backplane. Shipside wiring is attached to a first portion of the connectors on the backplane. Connectors of the equipment are attached to corresponding connectors on the backplane.

In another aspect, a multi-dimensional backplane is provided that includes a plurality of composite layers, a plurality of flexible circuit layers comprising electrical conductors thereon, the flexible circuit layers disposed between plurality of composite layers, and a plurality of connectors attached to the backplane. The connectors include contacts configured to engage specific ones of the electrical conductors, a first portion of the connectors operable to attach to mating connectors associated with shipside wiring, and a second portion of the connectors operable to attach to mating connectors associated with electronic equipment to be deployed on the ship.

In still another aspect, a method for wiring an aircraft is provided. The method includes installing equipment in a plurality of volumes, the volumes defined by one or more of structural members and walls of the aircraft, installing a backplane that extends across at least a portion of the plurality of volumes, the backplane including a plurality of connectors, wherein the backplane includes a plurality of composite layers and a plurality of flexible circuit layers formed into a three dimensional sham connecting the equipment to a first plurality of the connectors on the backplane, and connecting shipside wiring to a second plurality of connectors on the backplane.

In yet another aspect, an aircraft is provided that includes a plurality of volumes defined by one or more of structural members and walls of the aircraft, a plurality of electronic equipment items installed on the aircraft and disposed within the plurality of volumes, and a backplane disposed within one or more of the volumes within the plurality. The backplane is operable to electrically interconnect shipside wiring with contacts associated with electrical connectors of the plurality of electronic equipment items, wherein the backplane extends across a plurality of frame bays associated with the aircraft.

The features, functions, and advantages that have been discussed can be achieved independently in various embodiments or may be combined in yet other embodiments further details of which can be seen with reference to the following description and drawings.

DETAILED DESCRIPTION

In various embodiments, backplanes are utilized to generally provide a two or three dimensional structure for simplifying the interface between vehicle wiring and line replaceable equipment. In such embodiments, backplanes are utilized in two or three dimensions to translate wiring interfaces away from spatially confined areas where line replaceable equipment is installed to areas that are less congested, perhaps unable to accommodate line replaceable equipment or wiring integration panels, facilitating wire integration within the vehicle, such as sideship wiring in an aircraft. Such embodiments are particularly useful where spatial restrictions would otherwise preclude installation of equipment or where it is desirable to reduce labor hours in the build flow. When equipment wiring interfaces are translated through backplanes away from the equipment and/or structure into uncongested areas, wire separation requirements are more easily met.

In one embodiment, technical effects of the methods, systems, and computer-readable media described herein include at least one of: (a) installing a multi-dimensional backplane within the aircraft, the backplane including a plurality of connectors mounted thereon, contacts associated with the connectors interconnected by electrical conductors formed within the backplane, (b) attaching shipside wiring to a first portion of the connectors on the backplane, and (c) attaching electrical connectors of the electronic equipment to corresponding connectors on the backplane.

As used herein, an element or step recited in the singular and proceeded with the word "a" or "an" should be understood as not excluding plural elements or steps unless such exclusion is explicitly recited. Furthermore, references to "one embodiment" of the present invention or the "exemplary embodiment" are not intended to be interpreted as excluding the existence of additional embodiments that also incorporate the recited features.

Figure 1:
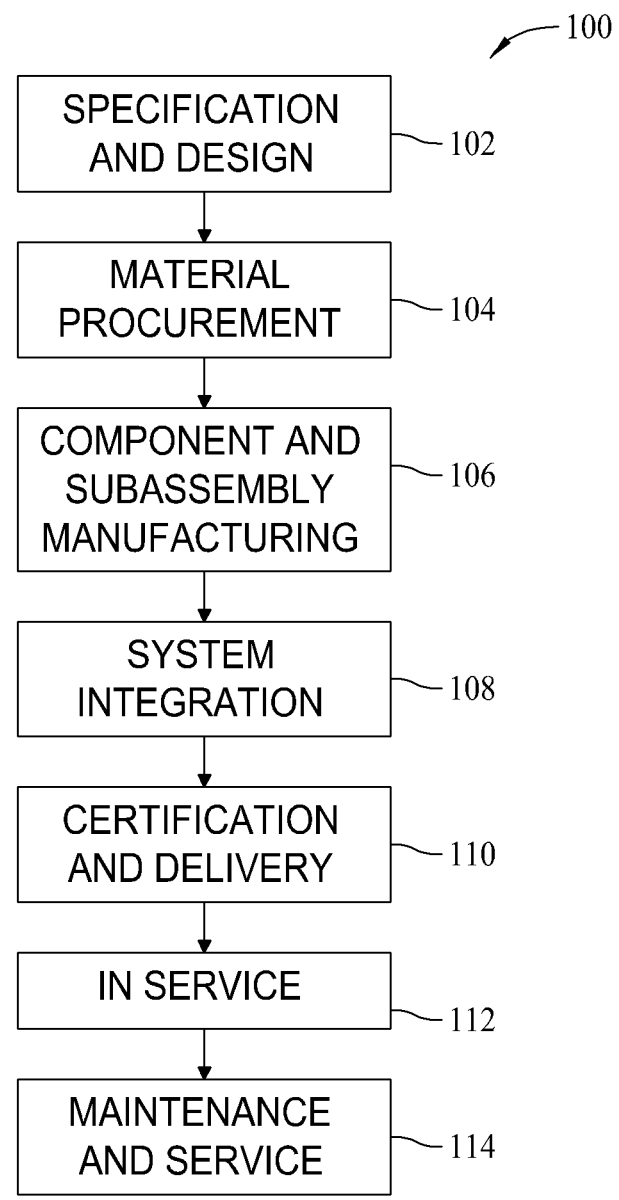
FIG. 1 is a flow diagram of an aircraft production and service methodology.
Figure 2:
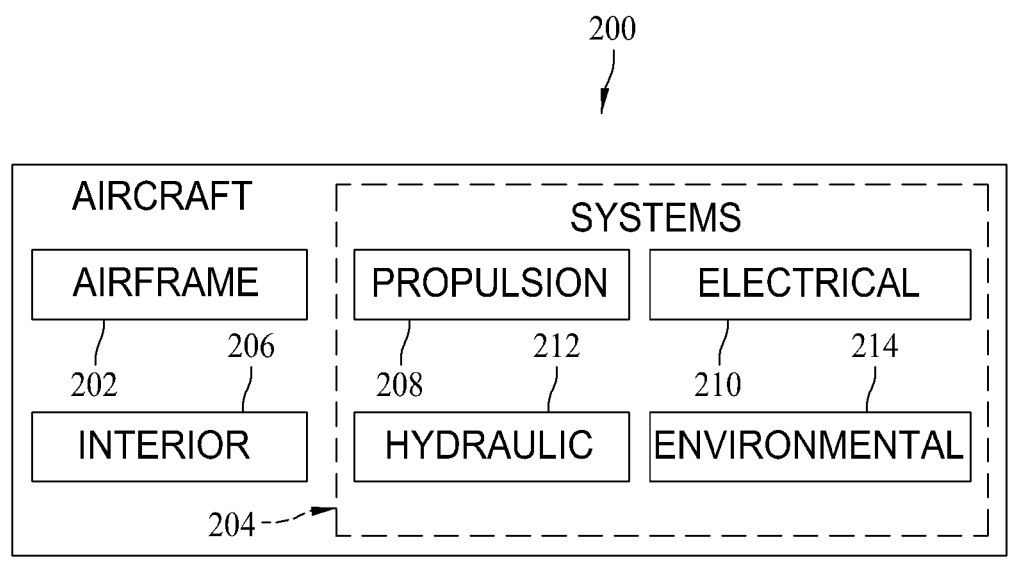
FIG. 2 is a block diagram of an aircraft.

Referring more particularly to the drawings, embodiments of the disclosure may be described in the context of an aircraft manufacturing and service method 100 as shown in FIG. 1 and an aircraft 200 as shown in FIG. 2. During pre-production, aircraft manufacturing and service method 100 may include specification and design 102 of aircraft 200 and material procurement 104.

During production, component and subassembly manufacturing 106 and system integration 108 of aircraft 200 takes place. Thereafter, aircraft 200 may go through certification and delivery 110 in order to be placed in service 112. While in service by a customer, aircraft 200 is scheduled for routine maintenance and service 114 (which may also include modification, reconfiguration, refurbishment, and so on).

Each of the processes of aircraft manufacturing and service method 100 may be performed or carried out by a system integrator, a third party, and/or an operator (e.g., a customer). For the purposes of this description, a system integrator may include, without limitation, any number of aircraft manufacturers and major-system subcontractors; a third party may include, for example, without limitation, any number of vendors, subcontractors, and suppliers; and an operator may be an airline, leasing company, military entity, service organization, and so on.

As shown in FIG. 2, aircraft 200 produced by aircraft manufacturing and service method 100 may include an airframe 202 with a plurality of systems 204 and an interior 206. Examples of systems 204 include one or more of a propulsion system 208, an electrical system 210, a hydraulic system 212, and an environmental system 214. Any number of other systems may be included in this example. Although an aerospace example is shown, the principles of the disclosure may be applied to other industries, such as the automotive industry, and other types of vehicles.

Apparatus and methods embodied herein may be employed during any one or more of the stages of aircraft manufacturing and service method 100. For example, without limitation, components or subassemblies corresponding to component and subassembly manufacturing 106 may be fabricated or manufactured in a manner similar to components or subassemblies produced while aircraft 200 is in service.

Also, one or more apparatus embodiments, method embodiments, or a combination thereof may be utilized during component and subassembly manufacturing 106 and system integration 108, for example, without limitation, by substantially expediting assembly of or reducing the cost of aircraft 200. Similarly, one or more of apparatus embodiments, method embodiments, or a combination thereof may be utilized while aircraft 200 is in service, for example, without limitation, to maintenance and service 114 may be used during system integration 108 and/or maintenance and service 114 to determine whether parts may be connected and/or mated to each other.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

Figure 3:
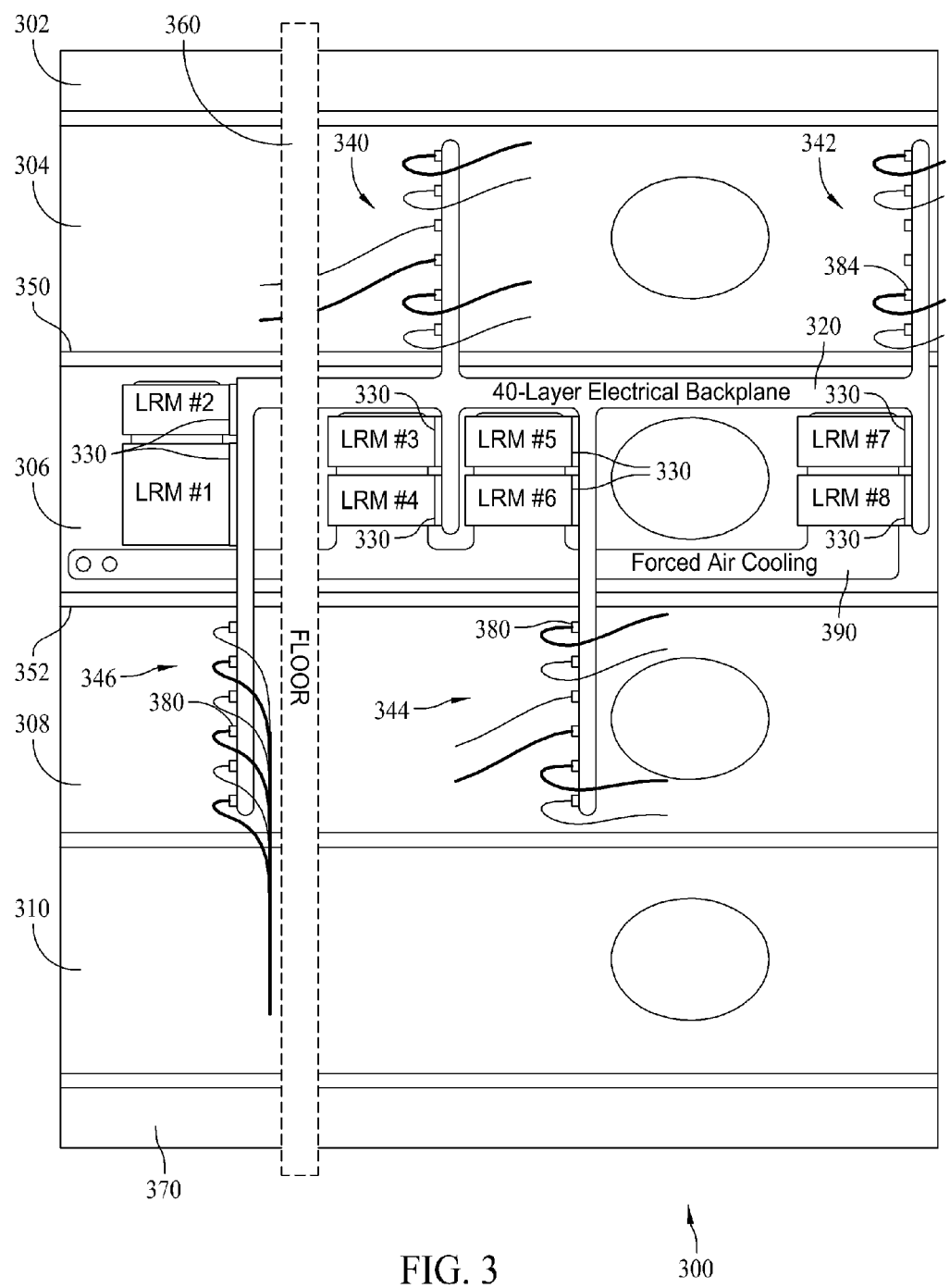
FIG. 3 is an illustration of a notional equipment installation along an exterior wall of an aircraft.

FIG. 3 is a diagram of a portion of an aircraft 300 depicting a notional equipment installation along an exterior wall 302, across multiple frame bays 304, 306, 308, and 310 of the aircraft 300. Various aircraft equipment (shown in FIG. 3 as LRM #1 through LRM #8), sometimes referred to as "avionics" or "black boxes" is installed in bay 306, while a multi-layer backplane 320 translates the equipment wiring interfaces 330 associated with each piece of aircraft equipment into adjacent frame bays 304, 308 for interfacing with to shipside wiring 340, 342, 344, 346. As used herein, shipside wiring refers to any collection of electrical conductors (e.g., power and/or signaling conductors), optical waveguides, pneumatic lines, and/or hydraulic lines used to interconnect equipment within aircraft 300. Backplane 320 may include any combination of shipside wiring.

In various embodiments, backplane 320 can either translate to adjacent bays through penetrated frames 350, 352 that separate the frame bays 304, 306, 308 or around scalloped frames. In additional embodiments, the backplane 320 follows the contour of the exterior wall 302 from behind, for example, overhead stowage bins, down past the floor 360, into the cargo bay 370 as shown in FIG. 3. By translating wiring interfaces into adjacent, unoccupied frame bays, connectors 380 (only a portion of which are labeled in FIG. 3) immediately can provide the required system separation necessary to interface directly with shipside wiring 340, 342, 344, 346. Similar installation concepts can be applied to equipment installed between floor beams and/or any other volumes that are spatially constrained by structure and/or equipment volume. In exemplary embodiments, each connector 380 corresponds to the shipside wiring to which it is coupled. For example, connectors 380 may generally include electrical connectors with one or more conductors configured to carry electrical power and/or signals from electrical conductors within backplane 320.

As another example, FIG. 3 illustrates a forced air plenum 390. In exemplary embodiments, air plenum 390 is coupled to a pneumatic line within backplane 320. As discerned by those skilled in the art, the described embodiments are directed to the replacement of traditional equipment racks which typically have associated cooling provisions. One aspect of the described embodiments is that the backplane 320 can translate to be compatible with air plenum 390 or other air plenum configuration. As used herein, air plenum 390 refers to a dedicated "traditional" cooling plenum and/or an integration of engineered voids within a composite structure to channel a cooling medium throughout the backplane 320 which allows for delivery of cooling air to the various aircraft equipment configured to receive cooling air. In addition, or alternatively, and similar to air plenum 390, a hydraulic fluid plenum (not shown) may be coupled to a hydraulic line within backplane 320.

FIG. 3 also illustrates an optical connector 384. In exemplary embodiments, optical connector 384 is coupled to one or more optical waveguides (e.g., optical fibers) within backplane 320. Further, in some embodiments, optical connector 384 includes an optical-to-electrical converter configured to convert signals carried by the optical waveguide(s) in backplane 320 to electrical signals carried by an electrical conductor associated with aircraft equipment, and vice versa.

Figure 4:
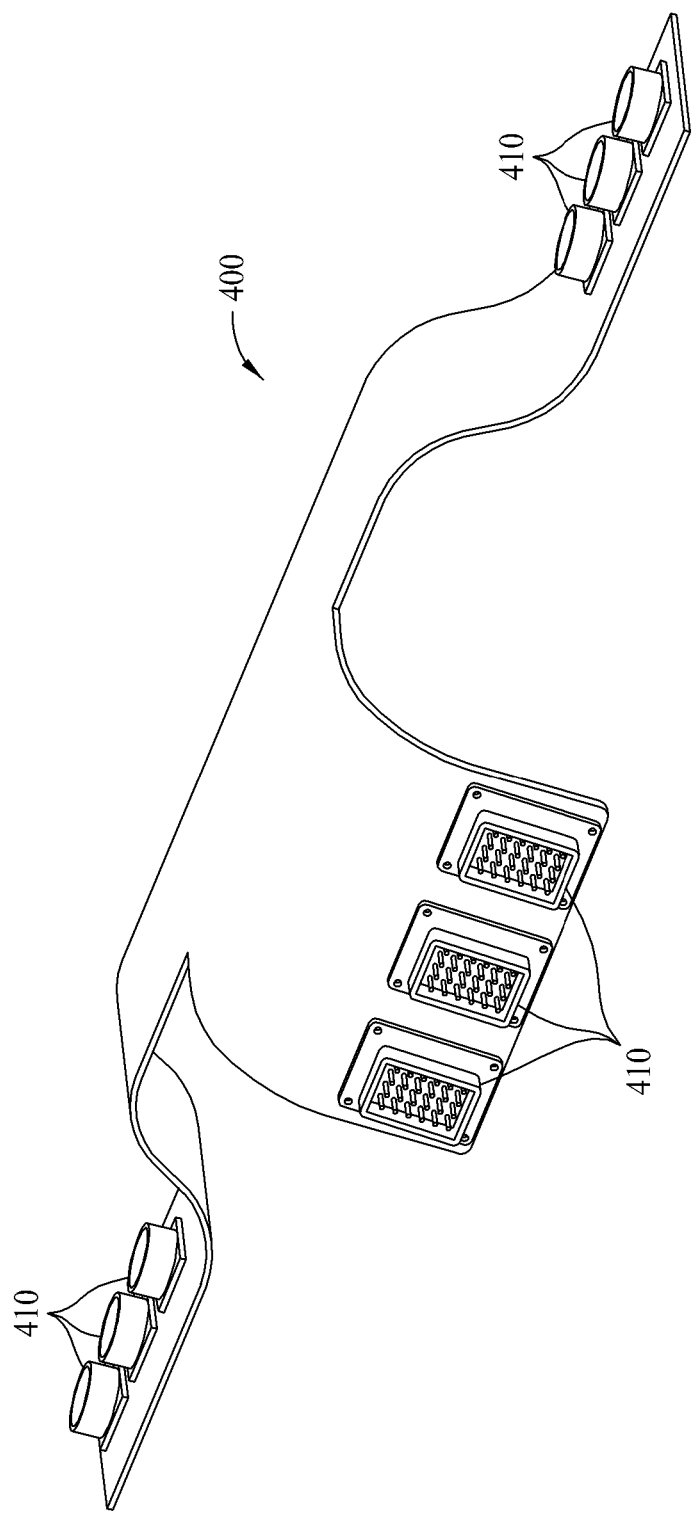
FIG. 4 is an illustration of a three-dimensional backplane of the type that might be utilized in the equipment installation of FIG. 3.
Figure 5:
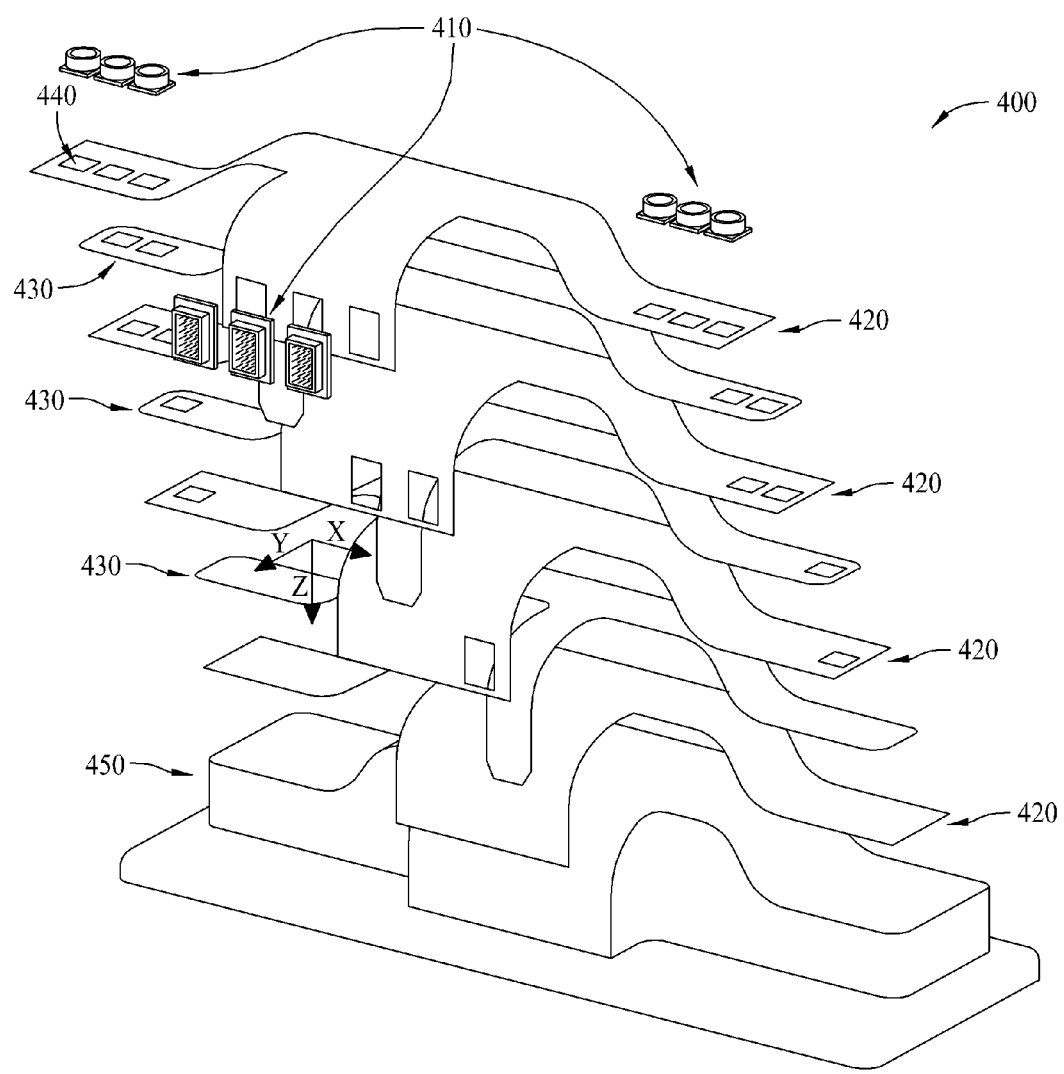
FIG. 5 is an exploded view of the three-dimensional backplane of FIG. 4.

FIG. 4 is an illustration of a three dimensional backplane 400 which might be utilized in an application similar to that described with respect to FIG. 3. FIG. 5 is an exploded view of backplane 400. As shown, backplane 400 incorporates a plurality of connectors 410 (equivalent to connectors 380 shown in FIG. 3) having a plurality of contacts associated therewith, which in combination with electrical conductors within the backplane 400 interconnect the various aircraft equipment within a portion of an aircraft, for example, equipment similar to LRM#1 through LRM #8. Although electrical conductors and connectors are described below, it is contemplated that the system described may include any combination of electrical conductors, optical waveguides, pneumatic lines, and/or hydraulic lines, and corresponding connectors.

Referring to FIG. 5, backplane 400 includes connectors 410 as previously mentioned, and a plurality of composite material layers 420. Such composite material layers 420 include one or more of pre-preg composite material layers, fiberglass layers or honeycomb composite layers 420. Backplane 400 further includes a plurality of flexible circuit layers 430, and appropriate vias 440 for mounting of connectors 410 (and the contacts associated with the connectors 410) and providing of access to electrical connections. A mold 450 may be utilized in the formation of backplane 400. When applied within aircraft, backplanes generally provide a two dimensional methodology for the simplification of the interfaces between shipside wiring and line replaceable equipment by translating wiring interfaces away from spatially confined areas to ones that are less congested, facilitating wire integration within the aircraft.

The currently utilized wire integration panels create a dedicated volume where manually routed wires, additional connectors, and wire splices are used to achieve wire separation and equipment-to-shipside-wiring integration. The multi-dimensional backplanes 320, 400 described herein perform the same functions within the backplane through automated processes where connectors, wires, and splices are no longer required. In the exemplary embodiment, backplane 320 includes a 40-layer electrical backplane distribution. The routing in the backplane is such that the pin terminations of each connector are already configured for ease of airplane integration. Alternatively, backplane 320 may include any number of layers that enables backplane 320 to function as described herein.

Multi-dimensional backplanes such as backplanes 320, 400 enable equipment to be placed in areas that previously did not support airplane wire integration. An aircraft production entity is able to achieve tighter packing densities through physical translation of wiring interfaces to previously unused space using one or more backplanes of the type described herein. The backplanes 320, 400 also eliminate the weight, cost, and additional volume required by wire integration panels, while also reducing the recurring labor hours associated with build-up of complex wiring bundles and wiring panels. By eliminating the additional wire splices, connectors, and wiring segments associated with wire integration panels, overall system reliability is also improved.

While the embodiments described herein are described in the context of an aircraft, the embodiments should not be construed to be so limited as such embodiments may be practiced in non-aircraft applications including, but not limited to, land vehicles, sea vehicles, space vehicles and other complex systems that incorporate multiple removable components interconnected through wiring.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for interconnecting equipment within an aircraft, the method comprising:
    installing a multi-dimensional backplane within the aircraft across a plurality of frame bays associated with the aircraft, the backplane including a plurality of connectors mounted thereon, the connectors interconnected by one or more of the following formed within the backplane: an electrical conductor, an optical waveguide, a pneumatic line, and a hydraulic line;
    attaching shipside wiring to a first portion of the connectors on the backplane; and
    attaching connectors of the equipment to corresponding connectors on the backplane.

2. The method according to claim 1 wherein installing the multi-dimensional backplane within the aircraft across a plurality of frame bays comprises at least one of routing the backplane through penetrated frames that separate the frame bays and routing the backplane around scalloped frames that separate the frame bays.

3. The method according to claim 1 wherein installing a multi-dimensional backplane within the aircraft comprises translating electronic equipment wiring interfaces associated with a plurality of aircraft equipment items into adjacent frame bays for interfacing with shipside wiring.

4. The method according to claim 1 wherein installing a multi-dimensional backplane within the aircraft comprises installing a backplane that follows a contour of an exterior wall of an aircraft.

5. The method according to claim 4 wherein installing a backplane that follows a contour of an exterior wall of an aircraft comprises installing a backplane that follows the contour of the exterior wall from behind a passenger bay down past a floor and into a cargo bay of the aircraft.

6. The method according to claim 1 wherein installing a multi-dimensional backplane within the aircraft comprises installing a backplane that provides a system separation between at least one of an item of electronic equipment and shipside wiring, and a plurality of electronic equipment items.

7. A multi-dimensional backplane comprising:
    a plurality of composite layers;
    a plurality of flexible circuit layers comprising electrical conductors thereon, the flexible circuit layers disposed between the plurality of composite layers; and
    a plurality of connectors attached to the backplane, the connectors comprising contacts configured to engage specific ones of the electrical conductors, a first portion of the connectors operable to attach to mating connectors associated with shipside wiring, and a second portion of the connectors operable to attach to mating connectors associated with electronic equipment to be deployed on the ship.

8. The multi-dimensional backplane according to claim 7 wherein the plurality of composite layers and the plurality of flexible circuit layers comprise a three dimensional shape.

9. The multi-dimensional backplane according to claim 7 wherein the backplane is configured for installation across a plurality of frame bays associated with an aircraft.

10. The multi-dimensional backplane according to claim 7 wherein the backplane is configured for translating electronic equipment wiring interfaces associated with a plurality of aircraft equipment items into adjacent frame bays for interfacing with shipside wiring.

11. The multi-dimensional backplane according to claim 7 wherein the backplane is configured to follow a contour of an exterior wall of an aircraft.

12. The multi-dimensional backplane according to claim 11 wherein the backplane is configured to follow a contour of an exterior wall of an aircraft from behind a passenger bay down past a floor and into a cargo bay of the aircraft.

13. The multi-dimensional backplane according to claim 7 wherein the backplane is configured for installation within one or more volumes spatially constrained by one or more of dimensions of a structure in which the backplane is to be deployed and a volume of the equipment deployed within the structure.

14. A method for wiring an aircraft, the method comprising:
    installing equipment in a plurality of volumes, the volumes defined by one or more of structural members and walls of the aircraft;
    installing a backplane that extends across at least a portion of the plurality of volumes, the backplane comprising a plurality of connectors, wherein the backplane includes a plurality of composite layers and a plurality of flexible circuit layers formed into a three dimensional shape;
    connecting the equipment to a first plurality of the connectors on the backplane; and
    connecting shipside wiring to a second plurality of connectors on the backplane.

15. The method according to claim 14 wherein installing a backplane comprises installing a backplane that is operable to provide separation between at least two signals associated with the plurality of equipment and the shipside wiring.

16. An aircraft comprising:
    a plurality of volumes defined by one or more of structural members and walls of the aircraft;
    a plurality of electronic equipment items installed on the aircraft and disposed within the plurality of volumes; and
    a backplane disposed within one or more of the volumes within the plurality, the backplane operable to electrically interconnect shipside wiring with contacts associated with electrical connectors of the plurality of electronic equipment items, wherein the backplane extends across a plurality of frame bays associated with the aircraft.

17. The aircraft according to claim 16 wherein the backplane is configured to provide separation between at least two signals associated with the plurality of electronic equipment items and the shipside wiring.

18. The aircraft according to claim 16 wherein the backplane is configured to follow a contour of one or more of a structural member and a wall of the aircraft.

* * * * *